(12) United States Patent
Begg

(10) Patent No.: US 6,249,128 B1
(45) Date of Patent: *Jun. 19, 2001

(54) AUTOMATED MICROWAVE TEST SYSTEM WITH IMPROVED ACCURACY

(75) Inventor: Matthew Thomas Begg, Waltham, MA (US)

(73) Assignee: Teradyne, Inc., Boston, MA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/955,782

(22) Filed: Oct. 22, 1997

(51) Int. Cl.[7] .............................. G01R 35/00; G01R 27/04
(52) U.S. Cl. ......................... 324/601; 324/638; 324/646
(58) Field of Search ................................ 324/600, 601, 324/407, 527, 763, 638, 646

(56) References Cited

U.S. PATENT DOCUMENTS

| 4,808,912 | 2/1989 | Potter et al. ...................... 324/58 B |
| 4,839,578 | 6/1989 | Roos .................................. 324/58 B |
| 4,853,613 | * 8/1989 | Sequiera .............................. 324/601 |
| 4,982,164 | 1/1991 | Schiek et al. ........................ 324/638 |
| 5,047,725 | 9/1991 | Strid et al. ........................... 324/601 |
| 5,191,294 | 3/1993 | Grace et al. ......................... 324/613 |
| 5,241,277 | 8/1993 | Kefalas ................................ 324/538 |
| 5,276,411 | 1/1994 | Woodin, Jr. et al. ............... 333/22 R |
| 5,434,511 | 7/1995 | Adamian et al. ................... 324/601 |
| 5,537,046 | * 7/1996 | Adamian ............................ 324/601 |
| 5,572,160 | 11/1996 | Wadell ................................ 327/427 |
| 5,587,934 | 12/1996 | Oldfield et al. ................. 364/571.01 |

FOREIGN PATENT DOCUMENTS

| 0 333 521 A1 | 9/1989 | (EP) .............................. G01R/27/04 |
| 0 715 177 A2 | 6/1996 | (EP) .......................... G01R/31/3167 |
| WO 89/04001 | 5/1989 | (WO) . |

* cited by examiner

*Primary Examiner*—Safet Metjahic
*Assistant Examiner*—Anjan K. Deb
(74) *Attorney, Agent, or Firm*—Teradyne Legal Department

(57) ABSTRACT

An automatic test system for microwave components. The test system includes internally switchable calibration references. As part of a calibration routine, incident power from a source is measured. During the measurement, calibration references are switched to change the amount of power reflected back to the source. Changes in the incident power are measured continuously while this change occurs. The resulting measurements allow the source match term to be determined. Correction is made to the source amplitude to adjust for the source match.

19 Claims, 3 Drawing Sheets

AUTOMATED MICROWAVE TEST SYSTEM WITH IMPROVED ACCURACY

This invention relates generally to test systems for microwave components and more particularly to calibration methods for such systems to improve accuracy.

Microwave devices are more and more being made using semiconductor manufacturing techniques. Such techniques allow the devices to be made in large quantities at lower cost. Such devices must be tested at a low cost, too. However, test accuracy should not be sacrificed An important way that test costs are kept low is through the use of automated test equipment. Devices are inserted mechanically into the test equipment and a series of tests are quickly run on the device. Modem automated test equipment can test the microwave circuitry on a semiconductor device. In addition, it can generate and measure digital signals, too. Thus, microwave devices can be fully tested in rapid succession.

To ensure accuracy, the test system is calibrated. Traditional calibration of microwave instrumentation is done by connecting a series of calibration references to the test ports of the test instrument. The test system then measures these calibration references and, because the actual values of the calibration references are known, the measurement error made by the test system can be identified. A series of parameters, often called s-parameters, is computed which form a mathematical model of the measurement circuitry leading up to the point where the calibration references are connected. The model can be used to predict distortion in a signal passing through the measurement instrument. Thus, the effect of the signal distortion, or error, can be eliminated mathematically.

A significant advance in calibration for automatic test equipment is described in U.S. Pat. No. 5,572,160 to Wadell, which is hereby incorporated by reference. That patent describes automatic test equipment in which calibration references are mounted inside the automatic test system. Such a mounting arrangement is contrary to traditional calibration thinking which dictates that the calibration references are mounted in the place where a device under test would normally be mounted. However, that patent describes a unique calibration process used to allow accurate calibration with internal calibration references.

The above described calibration processes provide what is sometimes called VNA calibration. VNA measurements are used to determine what are essentially transmission and reflection coefficients of a device. These coefficients are based on the ratios of measured incident, transmitted and reflected power. The actual power used does not matter for VNA measurements because it becomes irrelevant when the ratios are computed.

To determine the actual power applied to the device under test, a power measuring device is used to measure the source power. The above mentioned patent to Wadell describes such a system used to measure source power.

However, the above described calibration measurements do not adjust for errors which change the power provided to the load. One such error is called "source match". Source match introduces an error when an incident signal is partially reflected by a device under test. The reflected portion of the wave travels back into the measurement instrument. A portion of the reflected wave will be reflected by the measurement instrument, to make a second order reflected signal traveling back to the load. This reflected portion can be predicted using the VNA calibration measurements. One of the s-parameters describes this reflection. Because the reflected portion can be computed, an adjustment can be made to avoid having the reflected portion cause an error.

However, not all of the signal reflected from the load will be reflected back to the load when it reaches the VNA circuitry. Part of that signal will travel through the circuitry until it reaches the source. At the source, some part of the reflected signal will again be reflected, creating another second level reflection. Because the VNA calibration process can not account for variations in signal level from the source, the second level reflection from the source can not be accounted for using traditional VNA calibration.

Typically, the second level reflection from the source is ignored. Often, it is assumed that the measurement instrument is perfectly matched to the device under test. and that there is no reflection from the device under test back toward the source. An effort is often made in designing a measurement system to ensure that the impedance of the source matches the impedance of the VNA circuitry. If the source impedance matches the impedance of the circuitry, there will be virtually no reflection from the source. However, it is often costly to design test equipment to ensure that the impedance of the source matches the impedance of the circuitry to which it is connected.

In many instances, the amount of reflected signal that reaches the source is very small. Thus, finding and correcting for the source match error has traditionally been ignored without significant errors. However, there are some instances where it would be desirable to make a lower cost test system by not precisely matching the source to the other circuitry while still maintaining accuracy through calibration. There will also be instances where high accuracy will be required and errors caused by source match need to be removed through calibration even though they are small. For example, if the test instrument is being used to measure the gain of a device or the 3 dB compression point, it is important that the true power into the device be accurately measured.

Unless some mechanism is used to adjust for source match errors, power sensitive measurements will vary with the reflection coefficient from the device under test. Thus, the test process will exhibit device to device variation, which is very undesirable. Likewise, power sensitive measurements will vary with the reflection coefficient from the source. Thus, the test process will exhibit tester to tester variations. Any form of variation in the test process of an automated factory is highly undesirable. Therefore, there is a great need to have a simple and accurate way to adjust for source match errors.

SUMMARY OF THE INVENTION

With the foregoing background in mind, it is an object of the invention to provide a simple and accurate way to adjust for source match errors.

The foregoing and other objects are achieved in an automatic test system containing calibration references that can be switchably connected into a signal path. A calibration routine is performed in which first one calibration reference is connected to the device and then a second calibration reference is connected such that the phase relationship of the measurements made with the first and second calibration references is preserved. These measurements are used in computing an adjustment for source match error, which is then subsequently used to reduce the effects of the error.

BRIEF DESCRIPTION OF THE DRAWINGS

The invention will be better understood by reference to the following more detailed description and accompanying drawings in which.

DESCRIPTION OF THE PREFERRED EMBODIMENT

Figure 1:
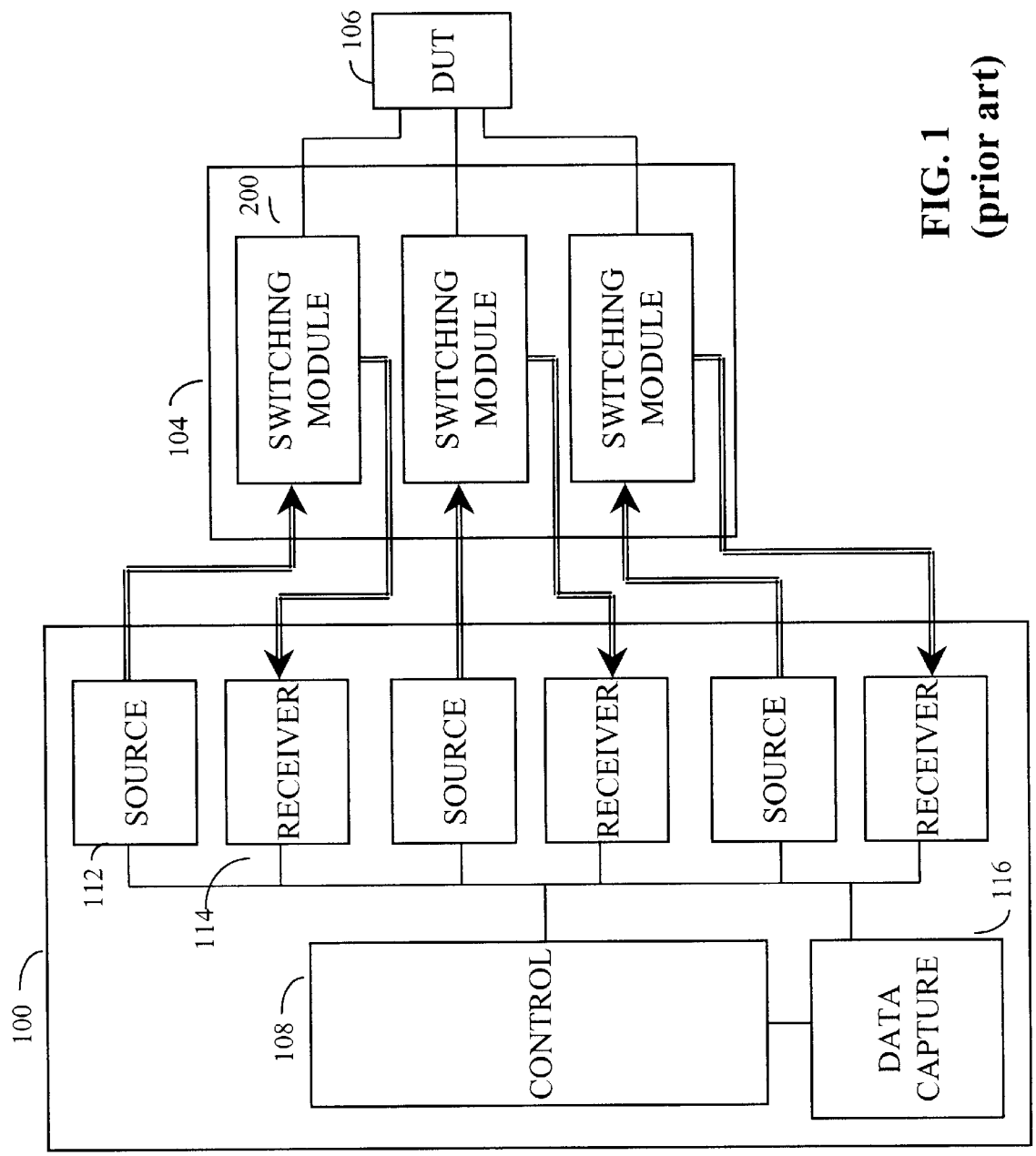
FIG. 1 is a sketch of a prior art automatic test system for testing microwave components.

FIG. 1 shows a prior art test system of they type used to test microwave components. The test system is made up of a tester body 100. Tester body 100 is connected to a device under test (DUT) 106 through test head 104.

Tester body 100 contains control circuitry 108. Control circuitry 108 is analogous to a general purpose computer that can be programmed to perform various test and operator interface functions and to generally perform mathematical computations. Control circuitry 108 could be implemented by a combination of special purpose control circuits and a computer work station, such as a SUN® work station. However, the exact architecture of control circuitry 108 will depend on the exact design of the test system and is not critical to the invention.

Control circuitry 108 controls various RF sources 112 and various RF receivers 114. These devices generate and measure test signals for DUT 106. The exact number of sources and receivers and also the functions that they will be set to perform will depend on the specific types of devices being tested and other factors and are not critical to the invention.

In addition, a test system might contain instruments that generate or measure other types of test signals. For example, there might be sources that generate DC voltages of low frequency AC signals. Further, a test system might contain circuitry to generate and measure digital signals. However, these additional components are known in the art and are not expressly shown.

Tester body 100 also contains data capture circuitry 116. Signals received by a receiver 114 can be routed to data capture circuitry 116. Data capture circuitry 116 contains high speed sampling circuitry and memory. Thus, the signal can be stored in digital form for processing by control circuitry 108.

Test head 104 routes signals between tester body 100 and DUT 106. Test head 104 contains a plurality of switching modules 200. Each switching module 200 is like the modules described in the above mentioned U.S. Pat. No. 5,572,160 to Wadell. They allow signals to and from DUT 106 to be routed in various ways for more flexible processing. Greater details are provided below in conjunction with FIG. 2.

Figure 2:
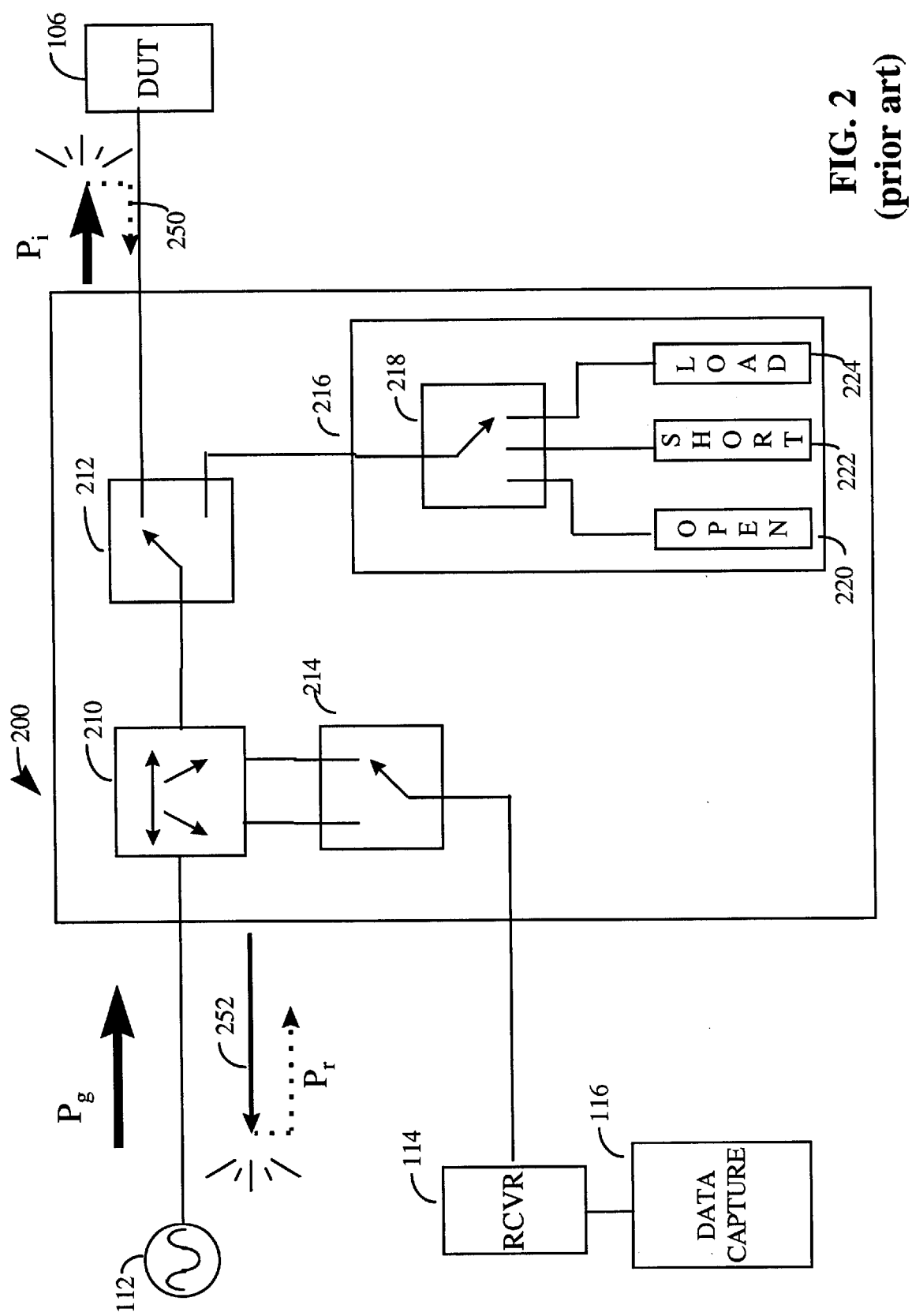
FIG. 2 is a sketch of a prior art internal calibration system.

Turning now to FIG. 2, a simplified form of switching module 200 is shown. Preferably, switching module 200 is made using solid state components, though many alternative construction techniques would also be suitable.

Switching module 200 contains a directional coupler 210 that connects to a source 112. One port of directional coupler 210 is connected to switch 212, that in turn can be switched to connect to DUT 106. In this way, switching module 200 can be configured to pass a signal from source 112 to DUT 106.

Any signals returning from DUT 106, such as a reflected signal, also can pass back through directional coupler 210. The reflected signals will appear at one of the ports of directional coupler 210 that is connected to switch 214. Switch 214 can select between ports of directional coupler 210 and pass the signal at that port to receiver 114. Thus, switch 214 can pass a signal reflected from DUT 106 to receiver 114 for measurement.

The second throw of switch 214 is also connected to directional coupler 210. However, it is connected to a different port of directional coupler 210. This port outputs signals that are applied to directional coupler 210 from the source side. In this way, receiver 210 can measure signals that are applied to directional coupler 210 from either the source side or the DUT side.

Switching module 200 also contains calibration references 216. As described in the above mentioned patent to Wadell, these calibration references can be used to quickly and accurately perform a VNA calibration of the test system. Switch 212 can be used to connect directional coupler 210 to calibration references 216 such that signals form source 112 can be applied to calibration references 216 and reflections from calibration references 216 can be routed to receiver 114.

Calibration references 216 are made up of several calibration references of different reflection characteristics. In general, there will be an open 220, short 222, load 224 and thru reference. The open and short references appear as open or short circuits, respectively. The load reference appears as a matched load. The thru reference connects directly to another port that is used to make two port measurements. In the preferred embodiment, calibration is based on a one port arrangement and the thru reference is not used and is not shown in FIG. 2. One of the references can be selected at a time through switch 218.

In general, the calibration references will not be precisely open, short or matched load. However, it is possible through known calibration techniques to determine the difference between the actual open, short or matched load values and the ideal values. Corrections can then be made mathematically using known computation techniques. For purposes of determining source match error, it is important that there be two references that can be connected to the source. The exact values of those references is not critical to operation of the invention.

FIG. 2 shows the problem of source match error in greater detail. An incident signal having a power, Pi, is applied to DUT 106. A portion of the incident signal 250 is reflected back towards the source. The amount of reflection depends on the impedance of DUT 106 in relation to the impedance of the circuitry connected to it.

A portion of signal 250 will be reflected back to DUT 106 when it reaches switching module 200. That reflection coefficient will be given by the s-parameters of the circuitry of switching module 200. One of the s-parameters is sometimes called $e_s$, and gives the amount of that reflection. The s-parameter model of switching module 200 is typically calculated as part of a calibration routine for the test system. Thus, this value can be determined using known calibration techniques. Because the value of $e_s$ is known, the first order effects of a reflected signal 250 can be computed and an adjustment can be made when determining the total incident power on DUT 106.

However, just accounting for first order effects does not address the whole effect of reflected signal 250. Signal 250 will pass through switching module 200 and appear as a reflected signal 252. Signal 252 will reflect from source 112 to create a signal with power $P_r$. Thus, the effective power from the source is $P_g + P_r$. $P_g$ is the actual power from the source.

It is important to note that $P_g$ and $P_r$ might be in phase or out of phase such that the total power could be more or less than $P_g$ alone. It is the term $P_r$ that represents the source match error and must be corrected to make accurate measurements.

In the simplified diagram of FIG. 2, all of the circuitry between source 112 and DUT 106 is represented by a switching module 200. In actuality, there might be numerous physical components between source 112 and DUT 106. However, they can be modeled mathematically as a single device with one set of s-parameters.

Figure 3:
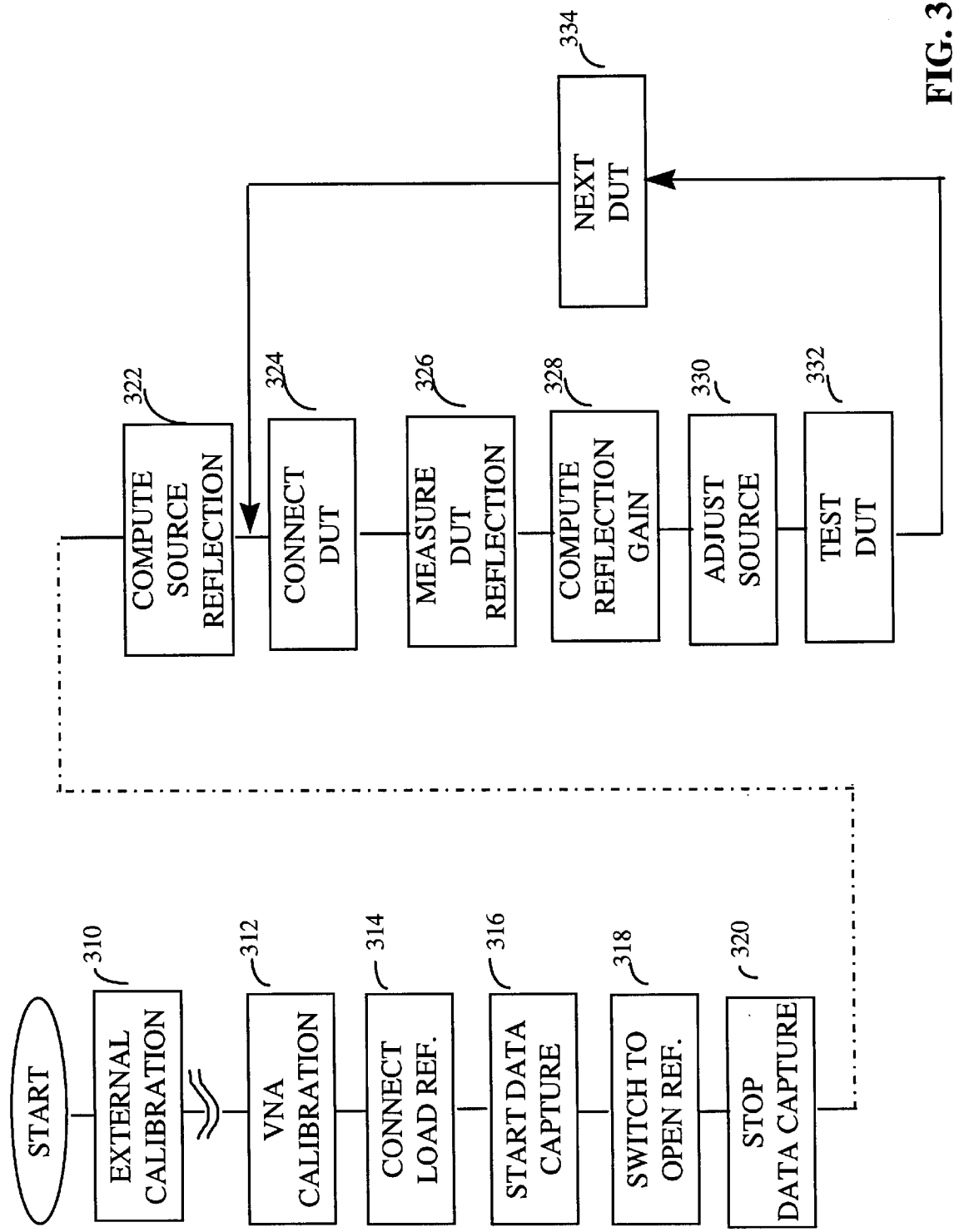
FIG. 3 is a flow chart showing a novel calibration process according to the invention.

Turning now to FIG. 3, the process of correcting for source match error is explained. The process indicated in FIG. 3 is performed under control of software that is programmed into control circuitry 108.

At step 310, an external calibration process is performed. External calibration is performed by replacing DUT 106 with calibration references (not shown) that are known to be highly accurate. A series of measurements are made on the external calibration references and the differences are compared to the expected values based on the values of the calibration references. Any differences between expected and actual values are taken to be the expected and actual values are attributable to distortion introduced by switching module 200 and are used to compute the s-parameters of switching module 200 to represent the distortion. Such a calibration is well known in the art.

An additional step of the calibration process that is also in the prior art as described in the above mentioned patent to Wadell is to assign values to the calibration references 216. Measurements are made on each of the calibration references 216. The calibration references 216 are then "mathematically de-embedded". De-embedding means that, using the s-parameters computed for switching module 200, a computation is made to determine what value of calibration reference would need to be connected in place of DUT 106 to yield the same measurements as were obtained when measurements were made on calibration references 216. Thus, the measurements made on accurate external calibration references are used to determine values to be used for the internal calibration references 216.

The next step is step 312. FIG. 3 shows a break between steps 310 and 312. It is contemplated that step 310 will be performed very infrequently. For example, it might be performed once when the test unit is at the factory. Thereafter, it might be performed relatively infrequently, such as at monthly servicing. The values assigned to the internal calibration references are stored in a nonvolatile memory for use in the interval between measurements. The break in the flow shown in FIG. 3 therefore represents the passage of time between steps 310 and 312 and also a change in configuration of the test system.

At step 312, another VNA calibration is performed. However, at step 312, the calibration is performed using only internal calibration references 216. No external calibration references are needed for this step. It is contemplated that step 312 will be performed periodically while a test system is in use on a factory floor. For example, it might be performed once a day or after every eight hours of use.

Calibration at step 312 is performed by connecting the internal calibration references 216, one at a time, through switch 212. Standard calibration measurements are used. However, the values of the calibration references are taken to be the values that were computed and stored in nonvolatile memory at step 310. The result of step 312 is an s-parameter model of the circuitry depicted in FIG. 2 as switching module 200. This model gives a value for $e_s$, that can be used to correct for a part of the effects of reflected signal 250.

In subsequent steps of FIG. 3, a gain factor is computed to correct for the remaining effects of the reflected signal. At step 314, the load reference of the calibration references 216 is connected through switch 212. Switch 214 is configured to pass through to receiver 114 incident signals. In other words, receiver 114 will measure the signal that is incident on directional coupler 210 from the direction of source 112. The incident signal will include $P_g + P_r$.

Source 112 is in a preferred embodiment configured to generate a sine wave at a frequency in the operating range of the test system. That frequency is typically in the range of 10 MHz to 6 GHz. The selected frequency is a frequency at which the test system will be operated. Typically, the source match will be a function of frequency. If, during a test, it is intended that the source will operate at multiple frequencies, source match terms can be determined and applied at each frequency. It is also possible that the source could be programmed to provide a test signal that contains multiple frequency components. In that case, spectral processing would be required to separately analyze each frequency component.

Once the test equipment is set, data capture circuitry 116 is triggered. It begins storing samples of the reflected signal. In a preferred embodiment, about 40 microseconds seconds of data is collected.

While data capture is still in process, switch 218 is actuated to connect open reference 220. Changing the calibration reference changes the amount of reflected signal 252 and therefore changes the amount of incident power on directional coupler 220. In a preferred embodiment, data capture circuitry continues to capture data for 40 microseconds after the switch is made.

Once sufficient samples of data under two load conditions are taken, data capture is stopped at step 320.

At step 322, the captured data is used to compute the source match, $\Gamma_s$. The source match is made up of two terms, $\Gamma_g + e_s$. The value of $e_s$ is determined from the VNA calibration at step 312. The value of $\Gamma_g$ is computed from the captured data. However, it is not necessary that the value of $\Gamma_g$ be separately calculated. The value of $\Gamma_s$ can be computed directly according to the equation:

$$\Gamma_s = \frac{I_2(1 - e_s \Gamma_{l1}) - I_1(1 - e_s \Gamma_{l2})}{I_2(1 - e_s \Gamma_{l1})\Gamma_{l2} - I_1(1 - e_s \Gamma_{l2})\Gamma_{l1}} \quad \text{EQ. 1}$$

where $\Gamma_{l1}$ and $\Gamma_{l2}$ are the reflection coefficients measured for the load calibration and the open calibration reference connected, respectively. These are the values that are computed and stored at step 310. $I_1$ and $I_2$ are the measurements made by receiver 114 with the load and open calibration references connected, respectively.

Specifically, $I_1$ and $I_2$ are derived by performing a Discrete Fourier Transform on the samples stored in capture circuitry 116 before and after the calibration reference is switched. To ensure consistency, the same number of sample points should be used to compute $I_1$ and $I_2$. The DFT provides a complex number giving an amplitude and a phase at a particular frequency. In a preferred embodiment, the number of samples between the first sample used to compute the DFT of $I_1$ and the first sample of the DFT of $I_2$ is selected so that the spacing between those samples is an integer multiple of the period of the signal being measured. In this way, the phase relationship between the two sample sets is preserved.

It is important to note that the quantities in EQ. 1 are complex numbers. In other words, they have both a magnitude and phase associated with them. In the preferred embodiment, it is described that $I_1$ and $I_2$ were measured by changing the calibration reference without changing either the settings on source 112 or receiver 114 and also without interrupting data collection. In this way, the phase relationship between the measured values of $I_1$ and $I_2$ is preserved, which makes it possible to solve EQ. 1 to obtain a value of $\Gamma_s$.

The magnitude of the reflected signal 252 and therefore the magnitude of $P_r$ depends on the amount of reflection from DUT 106. Thus, no correction can be made until the reflection coefficient of DUT 106 is computed.

At step 324, a specific DUT 106 is connected to the test system. This step is part of the normal testing of DUT 106. Connection might be made with automated semiconductor handling equipment, such as a wafer prober. Alternatively, the connection might be made manually.

With DUT 106 connected, the reflection coefficient of DUT is measured. As described above, prior art automatic test equipment can measure the s-parameters of a DUT 106. Measurement of s-parameters, because they depend on ratios of values, does not suffer from inaccuracies caused by source match. Thus, the reflection coefficient for DUT 106, $\Gamma_l$, can be measured before correction for source match error.

The above values can be used to compute the equivalent amount of gain to signal $P_g$ that can be attributable to the source match term $P_r$. This gain term is given by EQ. 2

$$G_n = \frac{1}{|1 - \Gamma_s \Gamma_l|^2} \quad \text{EQ. 2}$$

where the term for $\Gamma_l$ represents the reflection from the load.

The gain $G_n$ is then used at step 330 to adjust the source 112. In particular, the source setting is changed by the reciprocal of the gain. In this way, the combination of $P_g$ and $P_r$ provides an incident signal of the desired magnitude.

At step 332, DUT 106 is tested. In particular, any test where the magnitude of the incident power, and not just a ratio of incident powers, is important is performed at step 332. For example, measuring the 3 dB compression point of the device under test is performed at this step.

Once DUT 106 is tested, execution proceeds to step 334. At step 334, the next DUT is connected to the test system. This step could again be manual or automated.

Execution then returns to step 324. Measurements that depend on the value of the reflection coefficient of DUT 106 are repeated and correction is made for the next DUT. That DUT is then tested.

Having described one embodiment, numerous alternative embodiments or variations might be made. For example, it was described that measurements were made at step 314 and 318 using a load and an open calibration reference. The specific values of the calibration references are not important for the invention. Any two distinct references could be used as the basis for creating two equations in two unknowns that allow computation of the source match.

In addition, a preferred order is given for the steps in correcting for source match errors is given. However, the steps could be performed in almost any order. The actual order preferably will be selected as a matter of implementation convenience.

Moreover, a highly automated automatic test system was described as the preferred embodiment. The technique would still be useful where less automated systems are used.

It was described that the gain computed with EQ. 2 is used to adjust the source output level. To achieve greater accuracy, it is not necessary that the source amplitude actually be adjusted. Alternatively, any measurement that depends on the magnitude of the incident signal could be adjusted based on the computed gain. Actually adjusting the source value, though, has the advantage of not requiring that a gain term be associated with every measurement and also allowing all devices to be tested at the same power level.

Also, Equation 2 provides one definition of gain that is useful when it is desired to control the power incident to the load. If it is desired to have the source calibrated for available power or power delivered to the load, a different definition of gain would be applicable. Thus, the invention is not limited to the specific gain equation given.

Further, it was described that data was continuously captured while the calibration references were switched. Continuously capturing data allows the resulting measurements to have a known phase relationship. Other methods of determining the phase relationship between measurements might be used. For example, each signal might be compared to a third signal of known phase.

Moreover, a simplified model has been used in which all circuitry between the source and DUT is modeled as a single switching circuit. The actual circuitry might be made up of multiple separate circuits and the s-parameters of each circuit might be computed separately. In particular, there will often be a fixture between the switching module and the DUT. However, it is well known in the art how to combine s-parameters for separate circuits into s-parameters that represent the combined circuitry. It is also known in the art how to relate reflection measurements taken at a first point to reflection measurements that would be observed at a second point when the s-parameters between the first point and the second point are known. Therefore, it is not necessary that the measurements be taken at exactly the point described herein. One of skill in the art could easily translate the equations given above into other formats based on the way the circuitry is physically defined for the purpose of determining s-parameters or taking measurements.

Further, the invention is described in terms of eliminating errors attributable to source match. It should be noted that there could also be error introduced by a receiver match term. However, the receiver match is generally much smaller than the source match term. Moreover, the computations described above will calibrate in part for receiver match. Thus, while the term "source match" has been used to convey the notion of signals incident on the test circuitry after being reflected from the direction of the source (as opposed to the direction of the DUT), the term is not intended to be strictly limited to errors attributable to signals reflected from the source.

Further, it was described that measurements were taken of signals incident on the switching module from the direction of the source. It is possible that equations could be derived by computing a gain from signals incident from the direction of the DUT. Such power is generally termed reflected power.

Also, it should be noted that it was described that discrete calibration references are shown connected to through a switch 218. Other ways to change the value of the calibration reference might be possible. For example, a variable load as described in U.S. Pat. No. 5,434,511 might be used. For the preferred embodiment, it is sufficient if the value of the calibration reference can be switched between two distinct, but predictable values, fast enough that the data capture memory 116 does not get full before samples after the switch are taken.

Therefore, the invention should be limited only by the spirit and scope of the appended claims.

What is claimed is:

1. In automatic test equipment having a source, a method of calibrating the automatic test equipment for source match comprising the steps of:

a) measuring the s-parameter $e_s$ of measurement circuitry provided with the automatic test equipment;

b) connecting a first calibration reference to the measurement circuitry;

c) measuring a reflection coefficient $\Gamma_{l1}$ of the first calibration reference, and measuring a first signal ($I_1$) incident on the measurement circuitry from a first direction;

d) connecting a second calibration reference to the measurement circuitry;

e) measuring a reflection coefficient $\Gamma_{l2}$ of the second calibration reference, and measuring a second signal ($I_2$) incident on the measurement circuitry from the first direction in a way that preserves the phase relationship between the first signal and the second signal; and f) computing, responsive to the measuring steps a, c, and e, an indication of error attributable to source match ($\Gamma_s$), said indication accounting for reflections of the first and second signals from the source.

2. The method of claim 1 additionally comprising the step of computing a gain based on the error attributable to source match and adjusting the amplitude of a signal provided by a source.

3. The method of claim 1 wherein signals incident from the first direction are incident from the direction of a source.

4. The method of claim 3 additionally comprising the step of computing a gain based on the error attributable to source match and adjusting the amplitude of a signal provided by the source.

5. The method of claim 1 wherein the steps of connecting a first calibration reference and connecting a second calibration reference comprise switching a connection to calibration references internal to the automatic test equipment.

6. The method of claim 1 wherein the steps of measuring a first signal and measuring a second signal include continuously sampling from a time when the first calibration reference is connected until a time after the second calibration reference is connected.

7. The method of claim 6 wherein the step of measuring the first signal and measuring the second signal includes computing the discrete Fourier transform of segments of the continuously sampled signal.

8. The method of claim 1 further comprising the step of connecting a semiconductor device to the automatic test equipment and measuring the reflection coefficient from the semiconductor device and using the reflection coefficient and the computed source match term to compute a gain.

9. The method of claim 8 additionally comprising the steps of adjusting the amplitude of a source in accordance with the computed gain and thereafter running at least one test on the semiconductor device.

10. A method of operating automatic test equipment of the type having a source, a receiver with data capture memory coupled to the receiver and a calibration reference configurable to have one of a plurality of values connectable to the source and the receiver, the method comprising the steps of:

a) configuring the calibration reference to have a first value and connecting it to the source;

b) applying a signal from the source;

c) receiving, with the receiver, a signal ($I_1$) incident from the direction of the source and storing a first plurality of samples of the received signal in the data capture memory;

d) measuring a reflection coefficient of the calibration reference configured with the first value;

e) configuring the calibration reference to have a second value;

f) receiving, with the receiver, a signal ($I_2$) incident from the direction of the source and storing a second plurality of samples of the received signal in the data capture memory, the first plurality and the second plurality of samples having a predetermined time relationship;

g) measuring a reflection coefficient of the calibration reference configured with the second value; and h) analyzing the first plurality and the second plurality of samples and the measurements acquired in steps d and g to determine a source match factor match ($\Gamma_s$) based on the difference between the values of the first plurality of samples and the second plurality of samples.

11. The method of claim 10 additionally comprising the step of connecting a semiconductor device to the automatic test equipment and measuring a characteristic of the device and then using the measured characteristic with the source match factor to compute an adjustment factor for the source amplitude.

12. The method of claim 11 additionally comprising the step of adjusting the source amplitude based on the computed adjustment factor.

13. The method of claim 12 additionally comprising the steps of disconnecting the semiconductor device and connecting a second semiconductor device and repeating the steps of measuring a characteristic the second device, computing a second adjustment factor and adjusting the source amplitude.

14. The method of claim 10 additionally comprising the step of connecting calibration references external to the automatic test equipment, making measurements of the external calibration references and using the measurements to compute values representing the configurable calibration reference configured with the first value and the second value.

15. The method of claim 10 wherein the steps of storing a first plurality of samples and storing a second plurality of samples comprise continuously taking samples while the calibration reference is configured to the second value and for at least 20 microseconds thereafter.

16. The method of claim 15 wherein the first value of the calibration reference is a matched load and the second value of the calibration reference is an open.

17. The method of claim 15 wherein the first value of the calibration reference is a matched load and the second value of the calibration reference is a short.

18. The method as recited in claim 1, wherein the step of computing the indication of error attributable to source match comprises combining terms substantially according to the formula $$\Gamma_s = \frac{I_2(1 - e_s \Gamma_{l1}) - I_1(1 - e_s \Gamma_{l2})}{I_2(1 - e_s \Gamma_{l1})\Gamma_{l2} - I_1(1 - e_s \Gamma_{l2})\Gamma_{l1}}.$$

19. The method as recited in claim 10, wherein the step of analyzing the samples to determine the source match factor comprises combining terms substantially according to the formula $$\Gamma_s = \frac{I_2(1 - e_s \Gamma_{l1}) - I_1(1 - e_s \Gamma_{l2})}{I_2(1 - e_s \Gamma_{l1})\Gamma_{l2} - I_1(1 - e_s \Gamma_{l2})\Gamma_{l1}},$$

wherein $\Gamma_{l1}$ is the reflection coefficient of the of the calibration reference configured with the first value, $\Gamma_{l2}$ is the reflection coefficient of the calibration reference configured with the second value, and $e_s$ is an error adapter term indicative of a match between the automatic test equipment and a load.

* * * * *